United States Patent
Lagally et al.

(10) Patent No.: US 10,930,490 B1
(45) Date of Patent: Feb. 23, 2021

(54) ARRAYS OF HIGH-ASPECT-RATIO GERMANIUM NANOSTRUCTURES WITH NANOSCALE PITCH AND METHODS FOR THE FABRICATION THEREOF

(71) Applicants: Wisconsin Alumni Research Foundation, Madison, WI (US); The Regents of the University of New Mexico, Albuquerque, NM (US)

(72) Inventors: Max G. Lagally, Madison, WI (US); Francesca Cavallo, Albuquerque, NM (US); Vijay Saradhi Mangu, Albuquerque, NM (US)

(73) Assignees: Wisconsin Alumni Research Foundation, Madison, WI (US); The Regents of the University of New Mexico, Albuquerque, NM (US)

(*) Notice: Subject to any disclaimer, the term of this patent is extended or adjusted under 35 U.S.C. 154(b) by 0 days.

(21) Appl. No.: 16/727,201

(22) Filed: Dec. 26, 2019

(51) Int. Cl.
| | |
|---|---|
| *H01L 21/02* | (2006.01) |
| *H01L 21/308* | (2006.01) |
| *B82Y 20/00* | (2011.01) |
| *H01L 21/027* | (2006.01) |
| *H01L 21/3065* | (2006.01) |
| *H01L 21/8258* | (2006.01) |
| *H01L 29/16* | (2006.01) |
| *H01L 27/088* | (2006.01) |
| *G02B 5/30* | (2006.01) |
| *B82Y 40/00* | (2011.01) |

(52) U.S. Cl.
CPC ...... *H01L 21/02115* (2013.01); *G02B 5/3075* (2013.01); *H01L 21/0277* (2013.01); *H01L 21/3065* (2013.01); *H01L 21/8258* (2013.01); *H01L 27/0886* (2013.01); *H01L 29/16* (2013.01); *B82Y 20/00* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 8,173,551 B2 | 5/2012 | Bai et al. | |
| 8,524,614 B2 | 9/2013 | Shiu et al. | |
| 8,648,400 B2 | 2/2014 | Xu | |
| 10,680,176 B2 * | 6/2020 | Kim | ........... H01L 21/02603 |
| 2014/0134524 A1 | 5/2014 | Hobbs et al. | |

(Continued)

OTHER PUBLICATIONS

Yang et al., "Fabrication of Silicon and Germanium Nanostructures by Combination of Hydrogen Plasma Dry Etching and VLS Mechanism," Japanese Journal of Applied Physics, vol. 44, No. 7B, 2005, pp. 5791-5794.

(Continued)

*Primary Examiner* — Shamim Ahmed
(74) *Attorney, Agent, or Firm* — Bell & Manning, LLC

(57) ABSTRACT

Methods for fabricating thin, high-aspect-ratio Ge nanostructures from high-quality, single-crystalline Ge substrates are provided. Also provided are grating structures made using the methods. The methods utilize a thin layer of graphene between a surface of a Ge substrate, and an overlying resist layer. The graphene passivates the surface, preventing the formation of water-soluble native Ge oxides that can result in the lift-off of the resist during the development of the resist.

16 Claims, 4 Drawing Sheets

(56) References Cited

U.S. PATENT DOCUMENTS

| | | | | |
|---|---|---|---|---|
| 2016/0268128 | A1* | 9/2016 | Cheng | H01L 21/0254 |
| 2017/0062229 | A1* | 3/2017 | Nealey | H01J 37/32009 |
| 2018/0083013 | A1 | 5/2018 | Bao et al. | |
| 2018/0122648 | A1 | 5/2018 | Kim et al. | |
| 2018/0226242 | A1* | 8/2018 | Kim | H01L 21/02603 |
| 2020/0343273 | A1* | 10/2020 | Huang | H01L 29/0649 |

OTHER PUBLICATIONS

Richard Rojas Delgado, Dissertation "The Physical Electronics of Graphene on Germanium," 2017, 24 pages.

Fang et al., "Graphene masks as passivation layers in the electro-chemical etching of silicon," J Mater Sci (204) 49, pp. 7819-7823.

Gillis et al., "Precision, Damage-Free Etching by Electron-Enhanced Reactions: Results and Simulations," ECS Transactions, 50 (46) 2013, pp. 33-43.

Rojas Delgado, Richard, et al, "Passivation of Germanium by Graphene." *ACS applied materials & interfaces* 9.20 (2017): 17629-17636.

Aniruddh Rangarajan Thesis, "Graphene Etch Mask for Silicon," 2014, 38 pages.

Yu et al. "Top-down Process of Germanium Nanowires using EBL Exposure of Hydrogen Silsesquioxane Resist," 13th International Conference on Ultimate Integration on Silicon (ULIS) IEEE Mar. 2012, pp. 145-148.

Georgiev et al., "Georgiev Y.M. et al, (2014) Silicon and Germanium Junctionless Nanowire Transistors for Sensing and Digital Electronics Applications. In: Nazarov A., Balestra F., Kilchytska V., Flandre D. (eds) Functional Nanomaterials and Devices for Electronics, Sensors and Energy Harvesting. Engineering Materials. Springer, Cham,".

Duffy et al., "Processing of germanium for integrated circuits," Turkish Journal of Physics, 15 pages, Nov. 10, 2014.

Cavallo et al., "Semiconductor nanomembranes: a platform for new properties via strain engineering," Nanoscale Research Letters, 7: 628, 2012, 10 pages.

Jacobberger, Robert M., et al. "Passivation of Germanium by Graphene for Stable Graphene/Germanium Heterostructure Devices." *ACS Applied Nano Materials* (2019), pp. 4313-4322.

Zhang et al., "Total Ionizing Dose Effects on Strained Ge pMOS FinFETs on Bulk Si," IEEE Transactions on Nuclear Science, 2016, 14 pages.

Fujita, J., et al. "Ultrahigh resolution of calixarene negative resist in electron beam lithography." Applied Physics Letters 68.9 (1996): 1297-1299.

Takashima, Y. et al., "Ultraviolet polarizer with a Ge subwavelength grating." *Applied optics* 56, No. 29 (2017): 8224-8229.

M. J. H. van Dal et al., "Germanium p-Channel FinFET Fabricated by Aspect Ratio Trapping," in *IEEE Transactions on Electron Devices*, vol. 61, No. 2, pp. 430-436, Feb. 2014.

Littlejohns, C. et al. Next Generation Device Grade Silicon-Germanium on Insulator. Sci Rep 5, 8288 (2015). https://doi.org/10.1038/srep08288.

J. Feng, et al., "P-Channel Germanium FinFET Based on Rapid Melt Growth," in IEEE Electron Device Letters, vol. 28, No. 7, pp. 637-639, Jul. 2007.

P. Hashemi et al., "High-mobility high-Ge-content Si1—xGex-OI PMOS FinFETs with fins formed using 3D germanium condensation with Ge fraction up to x~ 0.7, scaled EOT~8.5Å and ~10nm fin width," 2015 *Symposium on VLSI Circuits (VLSI Circuits)*, Kyoto, 2015, pp. T16-T17.

* cited by examiner

ARRAYS OF HIGH-ASPECT-RATIO GERMANIUM NANOSTRUCTURES WITH NANOSCALE PITCH AND METHODS FOR THE FABRICATION THEREOF

REFERENCE TO GOVERNMENT RIGHTS

This invention was made with government support under DE-FG02-03ER46028 awarded by the US Department of Energy. The government has certain rights in the invention.

BACKGROUND

Ge Fin Field-Effect Transistors (FinFETs) promise superior performance for p-channel devices, as Ge has the highest hole mobility among widely available semiconductors. Multiple-gate FinFETs provide a higher drive current than their single-gate counterpart. Additionally, increasing the aspect ratio of the FinFETs and decreasing the pitch in a multi-gate architecture will yield higher on current for a given transistor footprint.

Ge nanogratings have a variety of potential applications, including immersion gratings in the near-infrared region, high-contrast gratings for integrated optoelectronics, and subwavelength gratings in polarizers for extreme-ultraviolet (EUV or XUV) light.

Conventional nanoscale patterning techniques based on electron beam (e-beam) or interference lithography and dry etching present issues when used to transfer periodic patterns with 10-50 nm lateral size and high aspect ratio onto Ge.

Previously proposed and reported technologies to fabricate Ge periodic structures with high aspect ratio and less than 50 nm width are: 1) Epitaxial growth of Ge in narrow, shallow trenches fabricated on Si substrates; and 2) Ge condensation in SiGe-on-insulator patterned gratings.

SUMMARY

Methods for fabricating thin, high-aspect-ratio Ge nanostructures from high-quality, single-crystalline Ge substrates are provided. Grating structures made using the methods and multi-fin field effect transistors incorporating the grating structures are also provided.

The methods for patterning a substrate comprising germanium utilize a substrate comprising germanium that has a passivating layer of graphene over at least one surface. The methods include the steps of: applying a resist layer comprising a photoresist or an electron beam resist over the passivating layer of graphene, such that the passivating layer of graphene is disposed between the substrate and the resist layer; forming a pattern in the resist layer; transferring the pattern from the resist layer into the passivating layer of graphene; transferring the pattern from the passivating layer of graphene into the substrate to form a patterned substrate; and removing the resist layer.

One embodiment of a grating structure includes: a substrate; and a plurality of single-crystalline germanium fins on a surface of the substrate, the germanium fins having widths in the range from 5 nm to 50 nm and aspect ratios in the range from 5 to 10.

One embodiment of a multi-fin field effect transistor includes: a substrate; a plurality of germanium fins arranged in parallel along their lengths on a surface of the substrate, each fin in the plurality having a base, a top, and two opposing side-walls, wherein the germanium fins have widths in the range from 5 nm to 50 nm and aspect ratios in the range from 5 to 10; a dielectric material that provides lateral electrical isolation of the germanium fins; a gate wrapped around the top and the two opposing side-walls of each germanium fin; and a gate dielectric disposed between the gate and the germanium fins.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Methods for fabricating thin, high-aspect-ratio Ge nanostructures from high-quality, single-crystalline Ge substrates are provided. Also provided are grating structures made using the methods. Various embodiments of the methods enable the patterning of periodic structures having lateral dimensions of 50 nm or less and aspect ratios of four or greater.

The methods utilize a thin passivating layer of graphene between a surface of a Ge substrate and an overlying resist layer. The layer of graphene is referred to as a "passivating layer" because the graphene serves to impede or even prevent the formation of native Ge oxides that would otherwise form on the surface of the Ge substrate in an oxygen containing environment. This is advantageous because water-soluble native Ge oxides can result in the lift-off of the resist during the development of the resist and, in particular, during the development of a resist that requires an aqueous developer. The use of the surface-passivating graphene interlayer makes it possible to reproducibly pattern nanostructures that are narrower and have higher aspect ratios than nanostructures patterned in the absence of the interlayer. The passivating layer of graphene can be applied to Ge substrates having various surface orientations, including Ge(110), Ge(001), and Ge(111). Because the methods can utilize high-quality, single-crystalline substrates, the resulting nanostructures are also composed of high-quality single-crystalline Ge. In addition, the lithographic patterning used to define the nanostructures does not require heating and, therefore, the methods are compatible with a wide range of device processing schemes.

Figure 1:
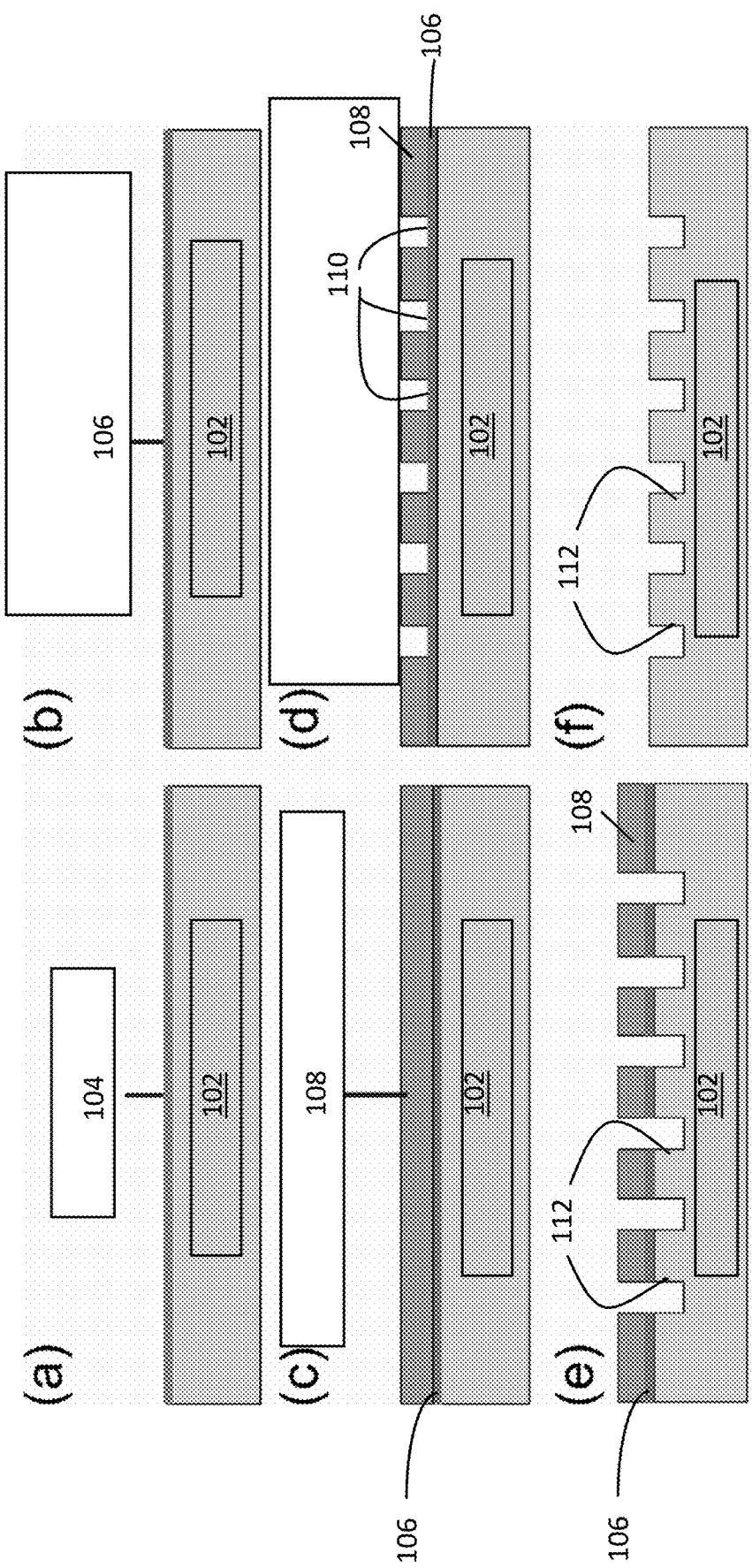
FIG. 1 (panels (a)-(f)) shows patterning of deep periodic Ge structures with ~10-50 nm lateral dimensions using graphene as an interfacial layer during processing. The Ge substrate can be bulk Ge or a Ge nanomembrane bonded to a rigid substrate.

One embodiment of a method of forming nanostructures is illustrated in the schematic diagrams of FIG. 1, panels (a) through (f). The process begins with a Ge substrate 102, the surface of which will typically be covered with a thin film of native germanium oxides 104 (panel (a)), which form in the presence of ambient air. Substrate 102 can be a bulk Ge substrate, such as a Ge wafer, or a thin layer of Ge disposed on a support substrate. For example, substrate 102 can be a layer of Ge having a thickness of 1000 nm or less, which, for the purposes of this disclosure, is referred to as a Ge nanomembrane. This includes layers of Ge having thicknesses of 500 nm or less. By way of illustration, the thickness of the layer of Ge can be in the range from 100 nm to 300 nm. For many device applications, it is necessary or desirable that substrate 102 and the nanostructures formed therefrom be single-crystalline. However, substrate 102 can be polycrystalline or even amorphous Ge if a single crystal is not required.

As used herein, the term germanium substrate refers to a substrate composed of germanium that is not alloyed with one or more other elements and is not part of a compound formed from germanium and one or more other elements. Similarly, the term germanium fin refers to a fin composed of germanium that is not alloyed with one or more other elements and is not part of a compound formed from germanium and one or more other elements. Thus, Ge substrates and Ge fins can consist of pure Ge. However, the germanium in a germanium substrate and a germanium fin can be intrinsically or extrinsically doped with acceptor or donor atoms, such as B, P, As, or Sb, that are incorporated into the germanium crystal lattice to alter the electrical and/or optical properties of the germanium. Such dopants are typically present at concentrations of $10^{20}$ cm$^{-3}$ or lower. Thus, a boron-doped Ge wafer would be considered a Ge substrate, but a compound semiconductor wafer composed of an alloy of Si and Ge ($Si_{1-x}Ge_x$, $0<x<1$) would not.

Substrates that comprise alloys of Ge with other elements or compounds of Ge and other elements are referred to herein as Ge-containing substrates. The methods described herein also can be used to pattern Ge-containing substrates that form water-soluble native Ge oxides, such as SiGe and GeSn substrates in thin-film and bulk form. Because of the extent of the problem posed by water-soluble native-oxide formation on Ge substrates, the present methods are particularly advantageous for use in patterning Ge substrates. However, to the extent that water-soluble oxides formed on germanium-containing substrates also create problems with resist lift-off during patterning, the present methods may also be beneficial for those substrates. Thus, the methods described herein can be adapted for use with germanium-containing substrates by replacing the Ge substrates with germanium-containing substrates. Examples of germanium-containing substrate that can be used include high-germanium-content SiGe alloys ($Si_{1-x}Ge_x$, $0.2<x<1$) and GeSn alloys ($Ge_{1-x}Sn_x$, $0<x<0.3$).

Transfer and bonding processes can be used to transfer a layer of Ge from a growth substrate onto a support substrate. Methods of transferring and bonding thin sheets of crystalline Ge are described in Cavallo et al., Semiconductor nanomembranes: a platform for new properties via strain engineering. *Nanoscale research letters,* 7(1), 628 and Sanchez et al. *PNAS* Nov. 22, 2011 108 (47) 18893-18898. Briefly, these methods can begin with a Ge-on-insulator structure in which a thin layer of Ge (the "device layer") is supported on a sacrificial oxide layer, which is supported on a bulk handle wafer. The sacrificial layer then can be removed to release the Ge device layer using a selective etch. The Ge device layer then can be transferred to a new support substrate using, for example, a rubber stamp. Alternatively, a Smart Cut' process can be used to form a thin layer of Ge in a bulk-Ge substrate via hydrogen ion implantation. The resulting thin layer can then be removed from the bulk substrate and transferred to a support substrate. The transferred Ge layer can be annealed to restore the crystal quality, if needed. Other methods of growing thin Ge films include growing the Ge on a lattice matched III-V substrate having an underlying sacrificial release layer (e.g., AlAs/GaAs) that enables the subsequent release and transfer of the Ge. A wide variety of support substrates can be used. Suitable support substrates include silicon (Si) and $SiO_2$ substrates; other semiconductor substrates, including Group III-V semiconductor substrates; sapphire substrates; organic polymer substrates, including polydimethylsiloxane (PDMA), polyimide, and polyethylene terephthalate substrates; metal substrates; and dielectric substrates, such as dielectric metal oxide or metal nitride substrates.

Native surface Ge oxide 104 can be removed using, for example, a vacuum anneal and/or sputter etching to reduce the concentration of native germanium oxides at the surface to a level at which the oxides do not contribute to the lift-off of the resist material. For embodiments of the methods in which the passivating layer of graphene is grown on the surface of the Ge substrate, the removal of native Ge oxides need not be a separate processing step, provided that the temperature at which graphene growth occurs is sufficiently high to remove native Ge oxides.

For the purposes of this disclosure, a Ge substrate surface having a water-soluble native oxide content that is sufficiently low to avoid lift-off of the resist material during development and exposure is referred to as a surface having a reduced germanium oxide content. While the removal of native oxide may result in a germanium-oxide-free surface, it is not necessary that one hundred percent of the native oxide be removed. For example, in some embodiments of the methods, it is sufficient that the layer of native germanium oxide at the surface of the Ge substrate is reduced to a sub-monolayer thickness. Moreover, because $GeO_2$ is highly water soluble, but sub-stoichiometric germanium oxides ($GeO_x$; $x<2$) are not, the removal of $GeO_2$ may be more important for the purposes of the methods described herein. Nevertheless, because sub-stoichiometric Ge oxides can catalyze the growth of $GeO_2$, it may be desirable to reduce the content of all Ge oxides on the surface.

Once native Ge oxide has been removed from the surface of Ge substrate 102, the substrate is maintained in an oxygen-free environment, or an ultra-low oxygen environment, and graphene 106 is provided on the surface. Graphene 106 can be "provided on" the surface by growing the graphene directly on Ge substrate 102 or by growing graphene on a different substrate and then transferring that graphene onto Ge substrate 102. Graphene can be formed on a Ge substrate or on another substrate using a vapor growth process, such as chemical vapor deposition (CVD), as illustrated in the Example. Substrates on which graphene can be grown for subsequent transfer include copper and nickel substrates. If the graphene is transferred, a dry transfer should be employed to avoid the formation of surface oxides on the Ge substrate. Methods for growing graphene directly on a Ge surface and methods for growing graphene on a copper substrate and then transferring that graphene onto a Ge surface are described in Rojas Delgado, et al. "Passivation of Germanium by Graphene." *ACS applied materials & interfaces* 9.20 (2017): 17629-17636. Graphene layer 106 can be a single sheet of graphene or can be multiple stacked sheets of graphene. Methods for growing graphene on a Ge surface and transferring graphene onto a Ge surface are described in Rojas Delgado, et al. "Passivation of Germanium by Graphene." *ACS applied materials & interfaces* 9.20 (2017): 17629-17636.

Whether direct growth of the graphene or graphene transfer is the preferred method may depend on the nature of the device being fabricated. If the Ge nanostructures are being incorporated into a device that includes heat-sensitive materials, a graphene transfer may be preferred because the transfer process can be accomplished at room temperature without heating. However, if the higher temperatures associated with CVD growth are not a concern, direct graphene growth may be preferred to avoid the defects and/or wrinkles that are sometimes introduced during graphene transfer.

Once the passivating layer of graphene 106 is on the surface of Ge substrate 102, a resist material is applied over graphene 106 to provide resist layer 108 (FIG. 1, panel (c)). Notably, the resist need not be applied immediately, as the graphene can passivate the Ge surface against oxidation for days, weeks, or even months. As a result, the graphene passivated Ge substrate can be formed by the same party that carries out the remaining steps of the method, as described below, or can be obtained (e.g., purchased) from another party that has prepared the graphene passivated Ge substrate in advance. For the purposes of this disclosure, the process of making the graphene passivated Ge substrate in-house and the process of obtaining a pre-made graphene passivated Ge substrate from another party are both referred to as "providing" a graphene passivated Ge substrate.

The nature of the resist material will depend upon the type of lithography that will be used for patterning. Negative or positive resists can be used. Interference photolithography and e-beam lithography are good choices for patterning nanostructures with very small width dimensions. If resist layer 108 is to be patterned via interference photolithography, the resist material will be a photoresist material, while if resist layer 108 is to be patterned via e-beam lithography, the resist material will be an e-beam resist material. Examples of photoresist materials that can be used for extreme and deep ultraviolet (EUV and DUV) interference photolithography include Inpria XE151B (IB), which is a hafnium-based inorganic photoresist, and hydrogen silsesquioxane (HSQ). Optionally, a top anti-reflection coating can be applied to the passivating layer of graphene prior to applying the photoresist over the graphene. Examples of e-beam resist materials include, ZEP 520A [i.e., a solution composed of 11% methyl styrene and chloromethyl acrylate copolymer (solid) and 89% anisole (solvent)] and HARP™ PMMA (polymethyl methacrylate). Resist layer 108 is then baked and exposed to form a pattern by removing portions of the resist material and exposing the underlying portions 110 of graphene 106 (FIG. 1, panel (d)). During resist development and exposure, the patterned resist remains firmly attached on the structure due to the adhesive interface provided by the graphene.

The pattern defined in resist layer 108 is then transferred sequentially into graphene 106 and Ge substrate 102, thereby forming one or more nanostructures 112 in Ge substrate 102 (FIG. 1, panel (e)). As used herein, the term nanostructure refers to a structure having a least one dimension, such as length, width, or height, with a size of 1000 nm or smaller. As discussed in more detail below, nanoscale width dimensions include dimensions of 50 nm or less. The pattern can be transferred into the graphene using an etch that is selective for graphene over the resist material, such as a reactive ion etch (RIE) or inductively coupled plasma (ICP) etch using fluorine. Optionally, resist layer 108 can be removed following the patterning of graphene 106, but prior to the patterning of Ge substrate 102.

In order to form nanostructures having substantially uniform widths along their longitudinal direction (i.e., along their height dimension) and smooth sidewalls, a highly anisotropic and low-energy etch should be used. Low-energy electron enhanced etching (LE4) is an example of a type of etch that can be used. LE4 is particularly well-suited for use in embodiments of the methods that remove resist layer 108 prior to patterning substrate 102 because LE4 is highly selective for Ge over graphene. As shown in FIG. 1, panel (e), the etch can extend into the surface and partially through the thickness of Ge substrate 102. However, the etch can also be deep enough to extend through the complete thickness of Ge substrate 102, particularly if Ge substrate 102 is a thin layer of Ge on a support substrate. In the latter case, the result is one or more freestanding Ge nanostructures attached to the support substrate. Once the patterning of Ge substrate 102 has been completed, resist layer 108 can be removed, if it was not removed in a previous step, and graphene 106 can be removed. The resist materials can be removed using appropriate solvents, and graphene can be removed using an oxygen plasma etch. However, provided it would not have a negative effect on the final device, the graphene need not be removed.

Figure 2:
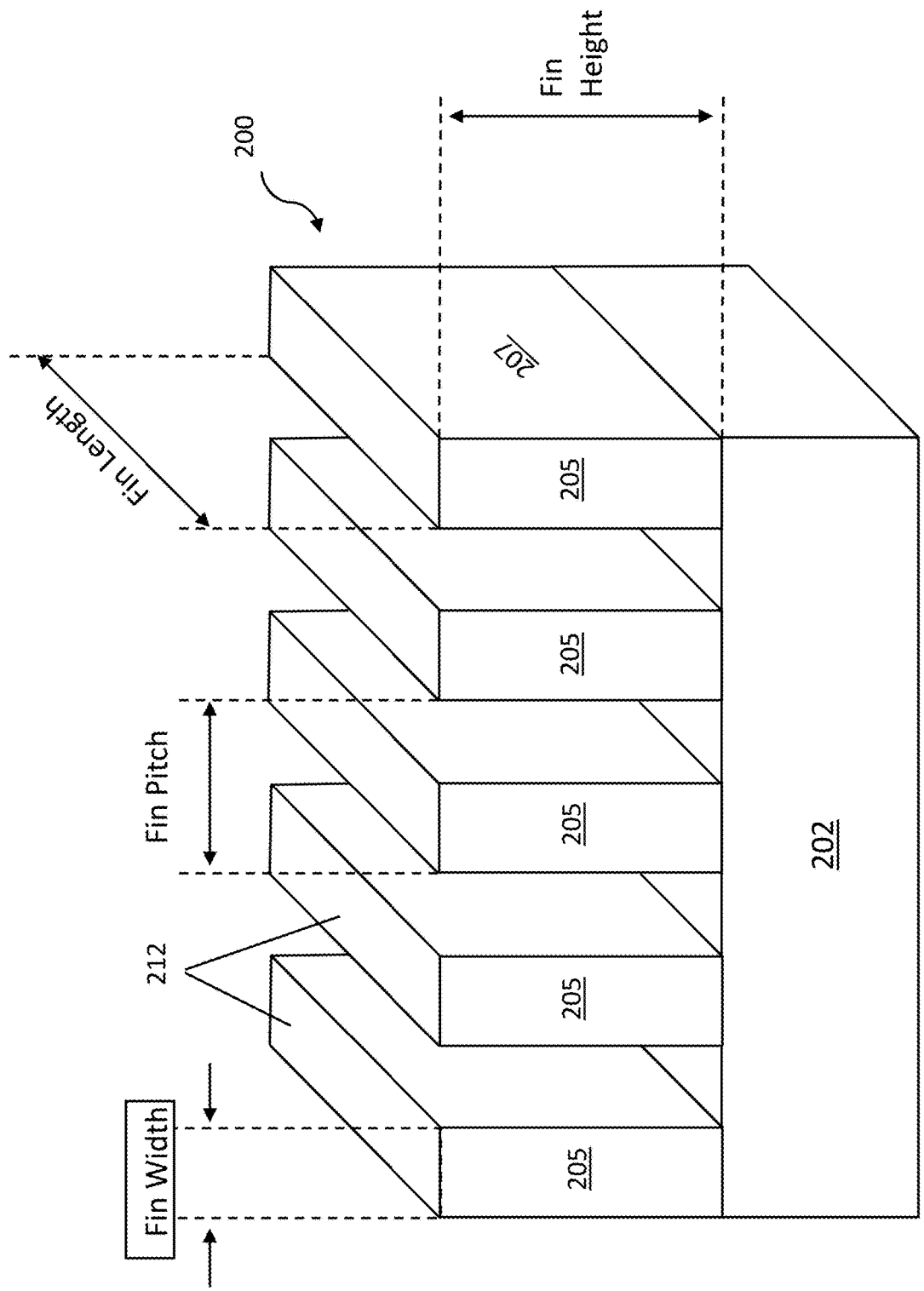
FIG. 2 is a schematic diagram of a sub-wavelength grating (SWG) polarizer.

The nanostructures defined in the Ge substrate may have various shapes and dimensions. For example, the nanostructures may be pillars, wires, fins, or a combination thereof. However, the methods described herein are particularly well suited for the fabrication of narrow, densely packed, high-aspect-ratio Ge nanofins, because existing methods of fabricating such structures have proved largely unsuccessful. As used herein, the term "fin" refers to an elongated structure having a height and a length that are longer than its width. Generally, the length of the fin will be greater than the fin height. As illustrated by the fins 212 shown in FIG. 2, the width of a fin corresponds to its narrowest lateral dimension, the height of a fin corresponds to the longitudinal thickness of the fin, and the length of the fin corresponds to the lateral dimension running perpendicular to its width. Fin pitch is the distance between neighboring fins, as measured from the same part of the fins; for example, from the left face of the fins, as shown in FIG. 2. Thus, fin pitch is the sum of the fin width and the spacing between the fins. Fins 212 are characterized by a substantially rectangular cross-section along their lengths and substantially rectangular end faces 205 and side walls 207. As used herein, the phrase "substantially rectangular" allows for some deviation from a perfect rectangular shape, based on the limitations on the anisotropic etch used to make the fins. For example, the fins may have some rounding to their edges and/or some variation in thickness along their heights, as the anisotropic etch is generally not perfectly anisotropic. By way of illustration, a substantially rectangular fin may be slightly broader at its base (i.e., the surface of the fin that faces the substrate) than at its top (i.e., the surface of the fin that faces away from the substrate). However, as illustrated in the Example and in FIG. 4, by utilizing appropriate anisotropic etching processes, Ge fins having widths that vary by less than 15% from base to top can be formed. The term "nanofin" refers to a fin having a width dimension of no greater than 500 nm. The height and width dimensions of a nanofin may also be nanoscale.

Using the methods described herein, Ge fins having widths of less than 50 nm and aspect ratios of at least four can be fabricated, where the aspect ratio of a fin is the ratio of its height to its width. This includes Ge fins having widths of 50 nm or less and aspect ratios of 5 or greater, and further includes Ge fins having widths of 40 nm or less and aspect ratios of 6 or greater. By way of illustration, Ge fins having widths in the range from 5 nm to 50 nm, including in the range from 10 nm to 50 nm, and aspect ratios in the range from 5 to 10 can be fabricated. The dimensions of the fin can be measured from scanning electron microscope (SEM) or transmission electron microscope (TEM) images of the fins. If the width of a fin is not perfectly uniform, the width of the fin corresponds to the fin's largest width dimension; if the height of a fin is not perfectly uniform, the height of the fin corresponds to the fin's smallest height dimension.

The fins can be fabricated with a wide range of length dimensions, which can be tailored based on the purpose the fins will serve in the devices into which they are incorporated. Typically, fin length will exceed fin height. For example, the length of a fin may be at least twice as long as its height, at least five times as long as its height, at least ten times as long as its height, or at least 100 times as long as its height. By way of illustration, fins having lengths in the range from 20 nm to 100 μm can be made. This includes fins having lengths in the range from 100 nm to 2 μm and fins having lengths in the range from 300 nm to 1000 nm. However, the lengths of the fins need not fall into these ranges.

The densities of the fins on a substrate can also vary widely and can be tailored based on the purpose the fins will serve in the devices into which they are incorporated. In some embodiments, the fins are densely packed with small spacing between neighboring fins. By way of illustration, arrays of aligned fins having a pitch of 500 nm or lower can be fabricated. This includes fins having a pitch of 100 nm or lower and further includes fins having a pitch of 100 nm or lower. By way of illustration, the fin pitch can be in the range from 20 nm to 100 nm.

Figure 4:
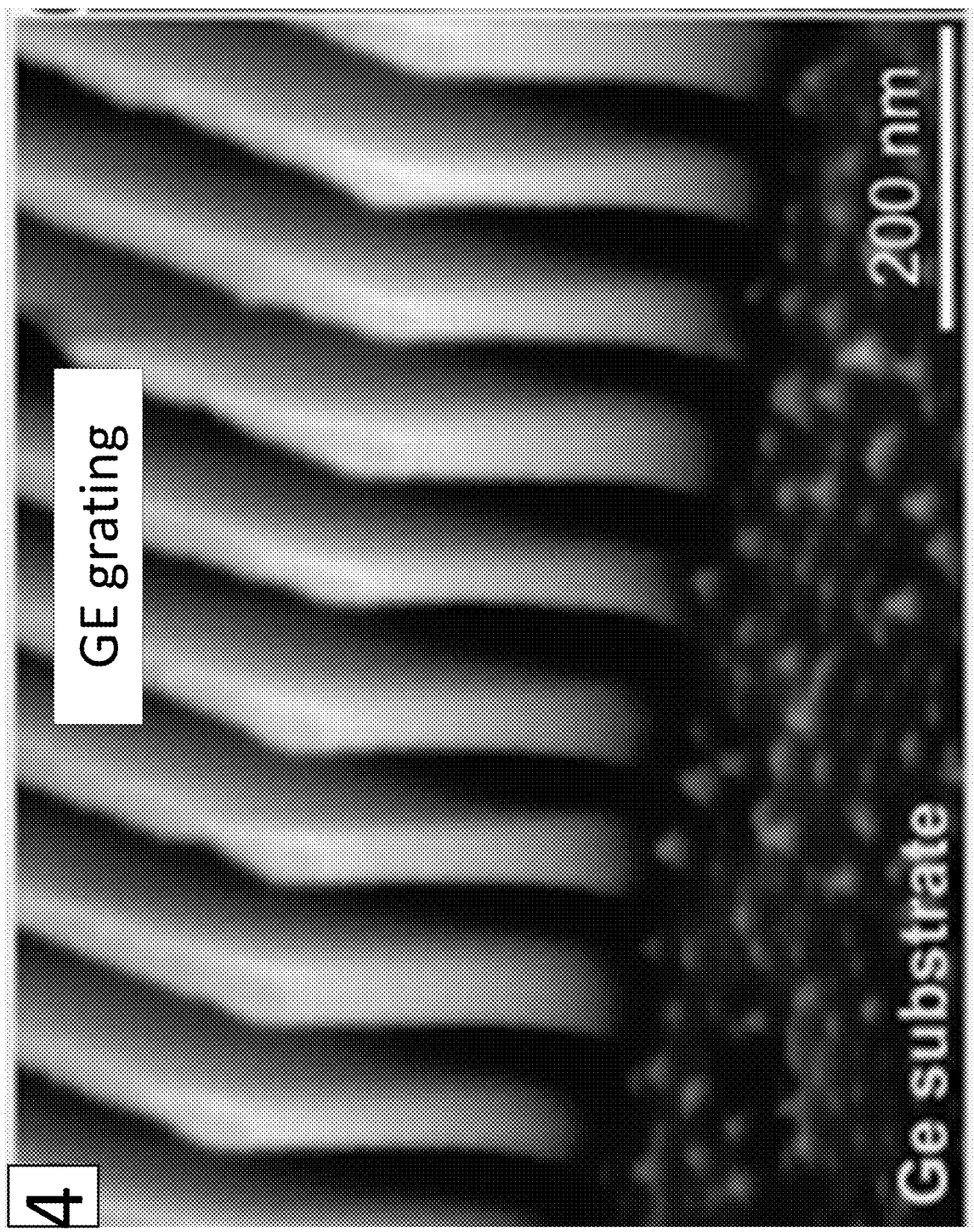
FIG. 4 is a scanning electron microscope image of a Ge grating structure.

As shown in FIG. 2, a plurality of fins 212 can be fabricated on a support substrate 202. When a plurality of nanofins are arranged in parallel along their lengths, as illustrated in FIG. 2 and FIG. 4, the structure is referred to as a nanograting 200. (FIG. 2 is not drawn to scale.) The number of nanofins in a nanograting is not particularly limited. By way of illustration, a nanograting can have 2 or more fins, 10 or more fins, 100 or more fins, or 1000 or more fins.

Figure 3:
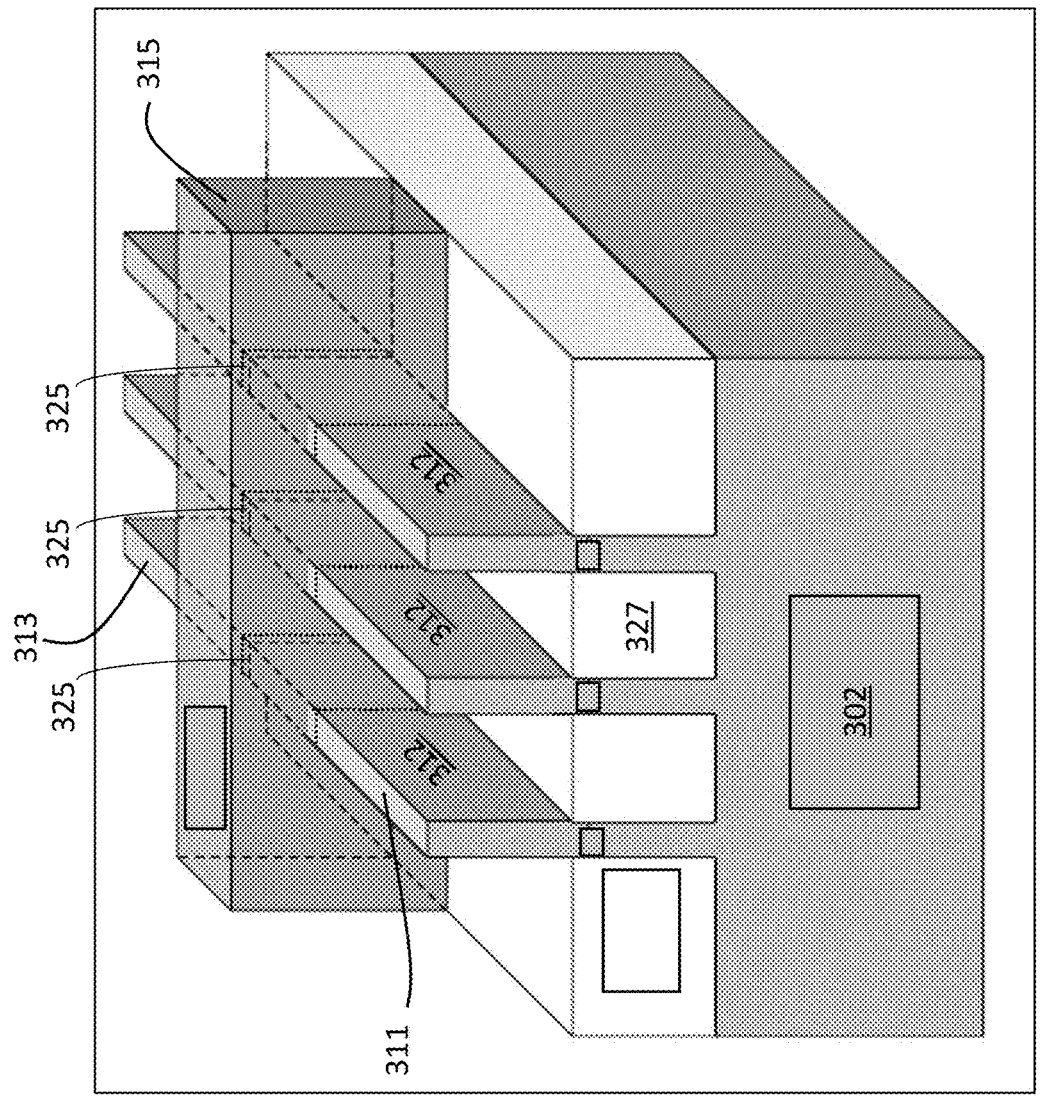
FIG. 3 is a schematic diagram of a FinFET.

The gratings can be designed for use in a variety of electronic and optoelectronic devices, including near-infrared (NIR) immersion gratings, gratings for integrated optoelectronics, sub-wavelength gratings in polarizers for EUV radiation, and MultiFinFETs. The structure of one embodiment of a MultiFinFET is shown in the schematic diagram of FIG. 3. The MultiFinFET is a non-planar or "3D" transistor that uses one or more germanium fins 312 as electrically conducting channels between source 311 and drain 313. Fins 312 rise vertically above the level of an electrical insulator 313. The use of narrow, high-aspect-ratio Ge fins allows multiple fins to operate on a single transistor substrate 302. Typical MultiFinFETs include two to four fins; however, a higher number can be used. A gate 315 wraps around the raised Ge fins on three sides, instead of only across its top, as in a traditional planar FET. Gate 315 is isolated from fins 312 by a layer of high-k dielectric material 325, such as an oxide (e.g., $HfO_2$ or $Al_2O_3$). The wrapping of the gate around three surfaces of the fin creates a larger surface area between the gate and the fin, thereby providing better control of the electric field and reducing the transistor's leakage current. Another advantage is that a lower gate voltage is needed to operate the transistor. Thus, relative to their planar counterparts, FinFETs provide improved performance and reduced power consumption.

A FinFET can be constructed by forming a plurality of Ge fins on a substrate, as described herein. To isolate fins 312, a layer of electrically insulating oxide 327 can be deposited over and around the fins, followed by etching to recess the oxide layer below the height of the fins. A thin layer of gate oxide 325 that will isolate the fins from the gate is then formed on the fins, using, for example, atomic layer deposition (ALD). Gate 315 is then formed over fins 312. Source, drain, and gate contacts can then be formed by metallization.

Example

This example demonstrates the fabrication of an array of Ge fins that can be used in devices, such as multiple-gate Ge FinFETs and Ge nanogratings.

The fins were formed from a bulk Ge crystal substrate (a Ge wafer), the surfaces of which were initially covered with native germanium oxides. Surface contaminants and native germanium oxides were removed from the Ge substrate surface by degreasing the substrate and rinsing it in water at 85° C. for 1 min, followed by exposure to UV light and a thermal anneal at 400° C. for 30 min under Ar flow (99.999%) at atmospheric pressure. The substrates were then removed from the tube furnace and monolayer graphene was then transferred immediately onto the surface of the Ge substrate via a dry-transfer process.

Monolayer graphene was grown by chemical vapor deposition (CVD) on a Cu foil. The Cu foil was cleaned with glacial acetic acid for 15 min to remove impurities and the native oxide from the surface. Upon rinsing in three deionized-water baths and drying with compressed air, the Cu substrate was annealed at 1323 K in 95% Ar and 5% $H_2$ to remove any residual contaminants and patches of native oxide, as well as to reduce surface roughness. Complete coverage of the Cu substrate with monolayer graphene occurred in 95% Ar and 5% $CH_4$ (0.300 sccm) after 3 h at 1323 K. Graphene was then peeled off the Cu substrate using a soft and highly adhesive polydimethylsiloxane (PDMS) stamp. The PDMS/graphene combination was then adhered onto the oxide-free Ge substrate. Upon 24 h, the PDMS was dissolved in a solution of tetrabutylammonium fluoride (TBAF) in N-Methelpyrrolidone (NMP). After ~20 h the PDMS was completely removed from the graphene/Ge surface.

Although the graphene in this example was transferred onto the Ge substrate, it is also possible to grow graphene directly on the surface of the Ge substrate. By way of illustration, this can be accomplished by placing the Ge substrate in a horizontal tube furnace that is pumped down to a pressure of less than $10^{-5}$ Torr and subsequently brought to atmospheric pressure with a flow of 200 sccm Ar (99.999%) and 100 sccm $H_2$ (99.999%). Graphene growth can be initiated by introducing an additional flow of 4.6 sccm $CH_4$ (99.99%). After approximately 14 hours (h), growth can be terminated by sliding the heated zone of the furnace away from the Ge substrate.

Next, a ZEP520A e-beam resist was applied to the graphene and e-beam lithography was used to form a nanoscale periodic fin pattern in the resist layer. The e-beam resist was developed in ZEP-N60 (n-Amil acetate).

The fin pattern from the resist layers was then transferred into the graphene via a 2 min oxygen plasma etch at 100 W. Once the fin pattern was defined in the graphene, reactive-ion etching (RIE) was used to transfer the pattern into the Ge substrate, resulting in the formation of a series of parallel nanoscale Ge fins with high aspect ratios (>5; FIG. 4) and narrow widths (<50 nm; FIG. 4) on the surface of the substrate. Finally, the resists and the graphene were removed from the Ge fins using N-methyl-2-pirrolidone at 75° C. and an oxygen plasma etch, respectively.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for patterning a substrate comprising germanium, the method comprising:
   providing a structure comprising:
   the substrate comprising germanium; and
   a passivating layer of graphene over a surface of the substrate;
   applying a resist layer comprising a photoresist or an electron beam resist over the passivating layer of graphene, such that the passivating layer of graphene is disposed between the substrate and the resist layer;
   forming a pattern in the resist layer;
   transferring the pattern from the resist layer into the passivating layer of graphene;
   transferring the pattern from the passivating layer of graphene into the substrate to form a patterned substrate; and
   removing the resist layer.

2. The method of claim 1, wherein the substrate is a doped or undoped germanium substrate.

3. The method of claim 2 further comprising removing the passivating layer of graphene from the patterned substrate.

4. The method of claim 2, wherein the resist layer is not removed prior to transferring the pattern from the passivating layer of graphene into the doped or undoped germanium substrate.

5. The method of claim 2, wherein the resist layer is removed prior to transferring the pattern from the passivating layer of graphene into the doped or undoped germanium substrate.

6. The method of claim 2, wherein the pattern from the passivating layer of graphene is transferred into the doped or undoped germanium substrate by low-energy electron enhanced etching.

7. The method of claim 2, wherein the patterned substrate comprises a plurality of germanium fins.

8. The method of claim 7, wherein the germanium fins have widths in the range from 5 nm to 50 nm and aspect ratios in the range from 5 to 10.

9. The method of claim 2, wherein the step of providing a structure comprising:
   the substrate comprising germanium; and a passivating layer of graphene over a surface of the substrate comprises growing a passivating layer of graphene directly on the surface of the substrate at a temperature at which native germanium oxide is removed from the surface.

10. The method of claim 2, wherein the step of providing a structure comprising:
    the substrate comprising germanium; and a passivating layer of graphene over a surface of the substrate comprises removing native germanium oxide from the surface of the substrate and transferring a passivating layer of graphene onto the surface of the substrate from which the native germanium oxide has been removed.

11. The method of claim 7, wherein the germanium fins are arranged in parallel on the surface of the substrate.

12. The method of claim 7, wherein the germanium fins have widths of less than 40 nm and aspect ratios of at least 6.

13. The method of claim 7, wherein the germanium fins have a pitch of 100 nm or less.

14. The method of claim 13, wherein the germanium fins have a pitch in the range from 20 nm to 100 nm.

15. The method of claim 7 comprising at least ten germanium fins.

16. The method of claim 15, wherein the germanium fins have widths in the range from 10 nm to 50 nm.

* * * * *

UNITED STATES PATENT AND TRADEMARK OFFICE
CERTIFICATE OF CORRECTION

PATENT NO. : 10,930,490 B1
APPLICATION NO. : 16/727201
DATED : February 23, 2021
INVENTOR(S) : Max G. Lagally et al.

Page 1 of 1

It is certified that error appears in the above-identified patent and that said Letters Patent is hereby corrected as shown below:

In the Specification

Column 1, Lines 8-10:
Delete the phrase "This invention was made with government support under DE-FG02-03ER46028 awarded by the US Department of Energy. The government has certain rights in the invention." and replace with --This invention was made with government support under DE-FG02-03ER46028 and DE-SC0020186 awarded by the US Department of Energy. The government has certain rights in the invention.--.

Column 3, Line 61:
Delete the phrase "a Smart Cut˙ process" and replace with --a Smart Cut™ process--.

Column 5, Line 34:
Delete the phrase "Inpria XE151B" and replace with --Inpria XE15IB--.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*